United States Patent
Bulatowicz et al.

(10) Patent No.: US 10,782,368 B2
(45) Date of Patent: Sep. 22, 2020

(54) PULSED-BEAM ATOMIC MAGNETOMETER SYSTEM

(71) Applicants: Michael D. Bulatowicz, Sun Prairie, WI (US); Thad G. Walker, Madison, WI (US); Michael S. Larsen, Woodland Hills, CA (US)

(72) Inventors: Michael D. Bulatowicz, Sun Prairie, WI (US); Thad G. Walker, Madison, WI (US); Michael S. Larsen, Woodland Hills, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 239 days.

(21) Appl. No.: 15/990,974

(22) Filed: May 29, 2018

(65) Prior Publication Data

US 2018/0348313 A1 Dec. 6, 2018

Related U.S. Application Data

(60) Provisional application No. 62/513,069, filed on May 31, 2017.

(51) Int. Cl.
*G01R 33/26* (2006.01)
*G01R 33/032* (2006.01)

(52) U.S. Cl.
CPC ........... *G01R 33/26* (2013.01); *G01R 33/032* (2013.01)

(58) Field of Classification Search
CPC .............................. G01R 33/26; G01R 33/032
See application file for complete search history.

(56) References Cited

U.S. PATENT DOCUMENTS

| 4,157,495 A | 6/1979 | Grover et al. |
| 5,189,368 A | 2/1993 | Chase |

(Continued)

FOREIGN PATENT DOCUMENTS

| EP | 3410142 A1 | 12/2018 |
| JP | 2001092676 A | 4/2001 |

(Continued)

OTHER PUBLICATIONS

Japanese Office Action for Application No. 2018-185554 dated Oct. 1, 2019.

(Continued)

*Primary Examiner* — Dixomara Vargas
(74) *Attorney, Agent, or Firm* — Tarolli, Sundheim, Covell & Tummino LLP

(57) ABSTRACT

One example includes a magnetometer system. The system includes a sensor cell comprising alkali metal vapor and a laser system configured to provide an optical pump beam through the sensor cell in a pulsed manner to facilitate precession of the alkali metal vapor in response to an external magnetic field and to provide an optical probe beam through the sensor cell in a pulsed manner based on a precession frequency of the alkali metal vapor. The system also includes a detection system configured to detect the precession of the alkali metal vapor in response to a detection beam corresponding to the optical probe beam exiting the sensor cell and to calculate an amplitude and direction of the external magnetic field based on the detected precession of the alkali metal vapor.

20 Claims, 5 Drawing Sheets

(56) References Cited

U.S. PATENT DOCUMENTS

| | | | |
|---|---|---|---|
| 5,227,722 A | 7/1993 | Kostyk et al. | |
| 6,314,215 B1 | 11/2001 | Shay et al. | |
| 6,472,869 B1 | 10/2002 | Upschulte et al. | |
| 7,145,333 B2 | 12/2006 | Romalis et al. | |
| 7,521,928 B2 | 4/2009 | Romalis et al. | |
| 7,826,065 B1 | 11/2010 | Okandan et al. | |
| 7,856,065 B2 | 12/2010 | Jonsson | |
| 7,893,780 B2 | 2/2011 | Bulatowicz et al. | |
| 7,965,148 B2 | 6/2011 | Larsen | |
| 7,994,783 B2 | 8/2011 | Ledbetter et al. | |
| 8,054,074 B2 | 11/2011 | Ichihara et al. | |
| 8,138,760 B2 | 3/2012 | Bulatowicz | |
| 8,159,220 B2 | 4/2012 | Bulatowicz et al. | |
| 8,212,556 B1 | 7/2012 | Schwindt et al. | |
| 8,300,566 B2 | 10/2012 | Kuo | |
| 8,305,078 B2 | 11/2012 | Savukov et al. | |
| 8,330,566 B2 | 12/2012 | Bulatowicz et al. | |
| 8,421,455 B1 | 4/2013 | Hovde et al. | |
| 8,487,729 B2 | 7/2013 | Bulatowicz | |
| 8,519,705 B2 | 8/2013 | Savukov et al. | |
| 8,587,304 B2 | 11/2013 | Budker et al. | |
| 8,600,691 B2 | 12/2013 | Griffith et al. | |
| 8,605,282 B2 | 12/2013 | Groswasser | |
| 8,994,371 B2 | 3/2015 | Larsen et al. | |
| 9,116,201 B2 | 8/2015 | Shah et al. | |
| 9,140,657 B2 | 9/2015 | Ledbetter et al. | |
| 9,229,073 B2 | 1/2016 | Walker et al. | |
| 9,329,152 B2 | 5/2016 | Walker et al. | |
| 9,366,735 B2 | 6/2016 | Kawabata et al. | |
| 9,500,725 B2 | 11/2016 | Bulatowicz | |
| 9,575,144 B2 | 2/2017 | Kornack et al. | |
| 9,618,362 B2 | 4/2017 | Bulatowicz et al. | |
| 9,638,768 B2 | 5/2017 | Foley et al. | |
| 9,645,205 B2 | 5/2017 | Larsen et al. | |
| 9,651,378 B2 | 5/2017 | Bulatowicz et al. | |
| 9,726,494 B2 | 8/2017 | Bulatowicz et al. | |
| 9,778,041 B2 | 10/2017 | Griffith | |
| 9,778,328 B2 | 10/2017 | Bulatowicz et al. | |
| 9,857,441 B2 | 1/2018 | Salit et al. | |
| 9,869,731 B1 | 1/2018 | Hovde et al. | |
| 9,927,501 B2 | 3/2018 | Kim et al. | |
| 9,964,610 B2 | 5/2018 | Shah et al. | |
| 9,970,999 B2 | 5/2018 | Larsen et al. | |
| 9,995,800 B1 | 6/2018 | Schwindt et al. | |
| 10,060,993 B2 | 8/2018 | Larsen et al. | |
| 10,162,021 B2 | 12/2018 | Kawabata et al. | |
| 10,215,816 B2 | 2/2019 | Kawabata et al. | |
| 10,274,549 B1 | 4/2019 | Ledbetter et al. | |
| 10,288,701 B2 | 5/2019 | Kobayashi et al. | |
| 10,416,245 B2 | 9/2019 | Bulatowicz | |
| 10,451,694 B2 | 10/2019 | Bulatowicz | |
| 10,539,929 B2 | 1/2020 | Larsen et al. | |
| 2004/0140799 A1 | 7/2004 | Romalis et al. | |
| 2005/0052650 A1 | 3/2005 | Wu | |
| 2009/0243610 A1 | 10/2009 | Ichihara et al. | |
| 2009/0256561 A1 | 10/2009 | Ledbetter et al. | |
| 2010/0090697 A1 | 4/2010 | Savukov et al. | |
| 2010/0156547 A1 | 6/2010 | McGuyer et al. | |
| 2010/0289491 A1 | 11/2010 | Budker et al. | |
| 2010/0308814 A1 | 12/2010 | Wu | |
| 2011/0025323 A1 | 2/2011 | Budker et al. | |
| 2011/0193555 A1 | 8/2011 | Sugioka et al. | |
| 2011/0279115 A1 | 11/2011 | Tuchman | |
| 2012/0112749 A1 | 5/2012 | Budker et al. | |
| 2012/0113423 A1 | 5/2012 | Groswasser | |
| 2012/0176130 A1 | 7/2012 | Ledbetter et al. | |
| 2013/0027041 A1 | 1/2013 | Savukov et al. | |
| 2013/0214773 A1 | 8/2013 | Ueno | |
| 2013/0265042 A1 | 10/2013 | Kawabata et al. | |
| 2013/0328557 A1 | 12/2013 | Larsen et al. | |
| 2014/0111198 A1 | 4/2014 | Tuchman | |
| 2014/0184216 A1 | 7/2014 | Walker et al. | |
| 2014/0206981 A1 | 7/2014 | Nagasaka | |
| 2014/0247045 A1 | 9/2014 | Kornack et al. | |
| 2014/0375313 A1 | 12/2014 | Salit et al. | |
| 2015/0042327 A1 | 2/2015 | Bulatowicz | |
| 2015/0212168 A1 | 7/2015 | Shah et al. | |
| 2015/0316625 A1 | 11/2015 | Bulatowicz | |
| 2015/0330786 A1 | 11/2015 | Bulatowicz et al. | |
| 2015/0346293 A1 | 12/2015 | Bulatowicz et al. | |
| 2016/0061913 A1 | 3/2016 | Kobayashi et al. | |
| 2016/0116553 A1 | 4/2016 | Kim et al. | |
| 2016/0146909 A1 | 5/2016 | Kawabata et al. | |
| 2016/0231395 A1 | 6/2016 | Foley et al. | |
| 2016/0223627 A1 | 8/2016 | Shah et al. | |
| 2016/0296145 A1* | 10/2016 | Bajaj | A61B 5/145 |
| 2016/0313417 A1 | 10/2016 | Kawabata et al. | |
| 2016/0334475 A1 | 11/2016 | Ueno | |
| 2017/0000375 A1* | 1/2017 | Demas | A61B 5/05 |
| 2017/0276741 A1 | 9/2017 | Bulatowicz | |
| 2018/0348313 A1 | 12/2018 | Bulatowicz et al. | |
| 2018/0372813 A1* | 12/2018 | Bulatowicz | G01R 33/26 |
| 2019/0101611 A1* | 4/2019 | Bulatowicz | G01R 33/0322 |
| 2019/0250223 A1 | 8/2019 | Palacios Laloy | |
| 2019/0293736 A1 | 9/2019 | Bulatowicz | |

FOREIGN PATENT DOCUMENTS

| | | |
|---|---|---|
| JP | 2010118553 A | 5/2010 |
| JP | 2012068251 A | 4/2012 |
| JP | 2014115290 A | 6/2014 |
| JP | 2016085200 A | 5/2016 |
| JP | 2016109665 A | 6/2016 |
| JP | 2017173329 A | 9/2017 |
| WO | 2015/002684 A2 | 1/2015 |

OTHER PUBLICATIONS

European Office Action for Application Serial No. 16 150 518.5 dated Jun. 19, 2019.

European Office Action for Application No. 19183917.4-1022 dated Dec. 4, 2019.

Patton B et al., "A Remotely Interrogated All-Optical Rb Magnetometer", Applied Physics Letters, American Institute of Physics, US, vol. 101, No. 8, Aug. 20, 2012, pp. 83502-83502, XP012164874, ISSN: 0003-6951, DOI: 10.1063/1.4747206 [retrieved on Aug. 21, 2012]*figure 1*.

European Article 94(3) EPC for Application No. 15 167 451.2-1022 dated Jul. 11, 2019.

Pustelny S. et al.: "All-optical atomic magnetometers based on nonlinear magneto-optical rotation with amplitude modulated light", Proceedings of the SPIE—The International Society for Optical Engineering, 14th International School on Quantum Electronics: Laser Physics and Applications, vol. 6604, 2007, pp. 660404-1-660404-8, XP040241875, * the whole document *.

Hovde C. et al.: Sensitive optical atomic magnetometer based on nonlinear magneto-optical rotation 11, Proceedings of the SPIE—The International Society for Optical Engineering, Unattended Ground, Sea, and Air Sensor Technologies and Applications XII, Apr. 5-8, 2010, 2010, pp. 769313-1-769313-1, XP040522954, USA * chapter 2.1 *.

Z. D. Grujic et al: 11 Atomic magnetic resonance induced by amplitude-frequency-or polarization-modulated light, Physical Review A (Atomic. Molecular. and Optical Physics). vol. 88. No. 1. Jul. 2013 (Jul. 2013). XP055513476. USA ISSN: 1050-2947, DOI: 10.1103/PhysRevA.88.012508 * sections VI and VII *.

European Search Report corresponding to EP 18 17 5089 dated Oct. 10, 2018.

Non Final Office Action for U.S. Appl. No. 16/053,535 dated May 1, 2020.

* cited by examiner

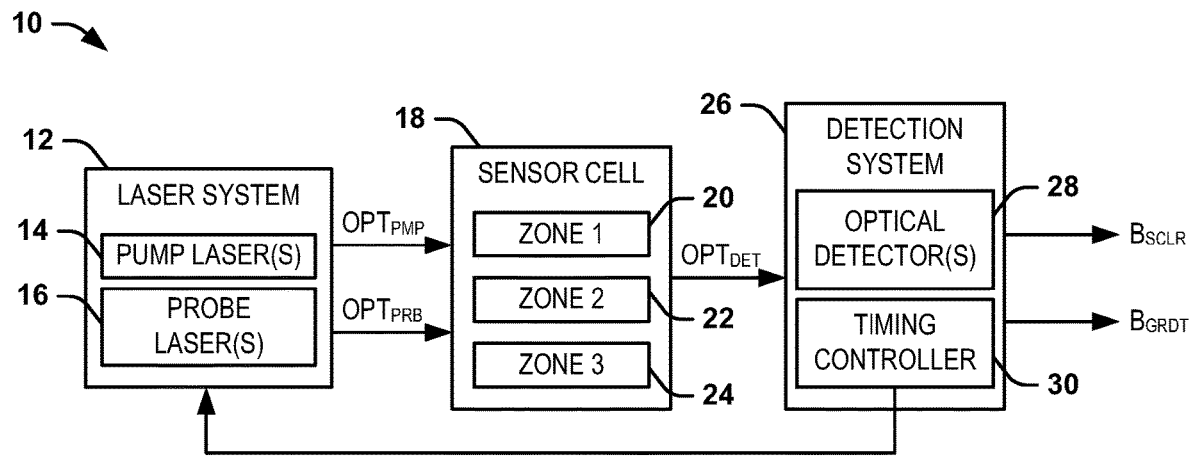
FIG. 1
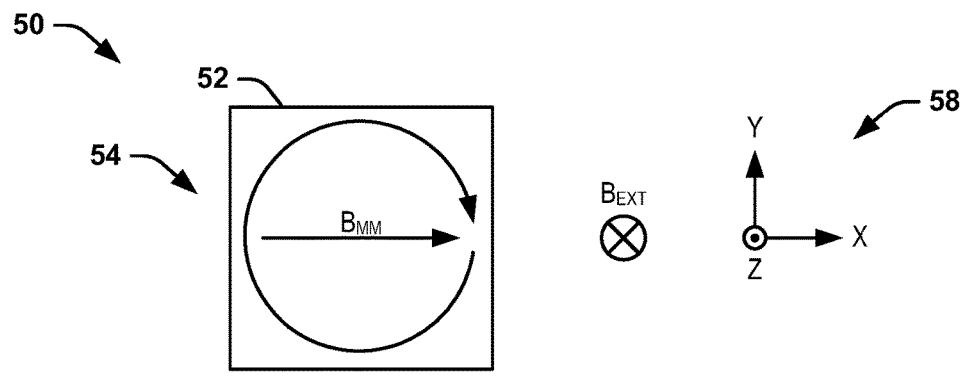
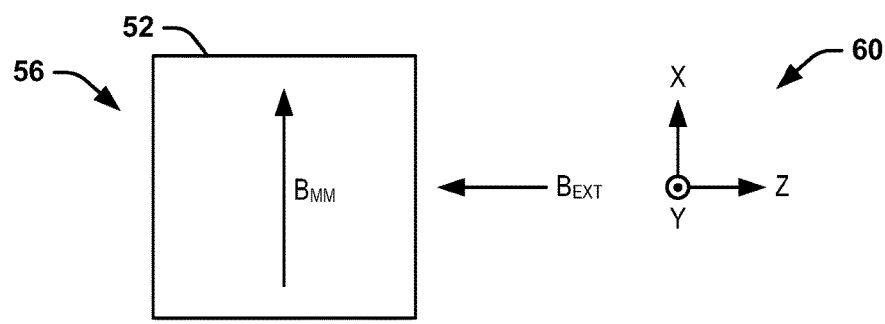
FIG. 2

PULSED-BEAM ATOMIC MAGNETOMETER SYSTEM

RELATED APPLICATIONS

This application claims priority from U.S. Provisional Application Ser. No. 62/513,069, filed 31 May 2017, which is incorporated herein in its entirety.

TECHNICAL FIELD

This disclosure relates generally to sensor systems, and more specifically to a pulsed-beam atomic magnetometer.

BACKGROUND

Magnetometer systems, such as nuclear magnetic resonance (NMR) magnetometers and/or electron paramagnetic resonance (EPR) magnetometers, can include a cell that contains one or more alkali metal vapors, such as rubidium or cesium, which can exhibit precession characteristics that can be a function of an external magnetic field. Thus, the magnetometer system can be configured to detect the external magnetic field based on the precession characteristics of the alkali metal vapor(s). Typical magnetometer systems that implement detection of the external magnetic field in three vector axes implement a combination of multiple single-axis or dual-axis vector systems. Such magnetometer systems can typically exhibit sensitivities to dynamics or system misalignments when attempting to determine a whole field scalar measurement, which can result in inaccuracy. Thus, when high sensitivity and stability may be required in a dynamic environment, whole field scalar magnetometer systems are often implemented.

SUMMARY

One example includes a magnetometer system. The system includes a sensor cell comprising alkali metal vapor and a laser system configured to provide an optical pump beam through the sensor cell in a pulsed manner to facilitate precession of the alkali metal vapor in response to an external magnetic field and to provide an optical probe beam through the sensor cell in a pulsed manner based on a precession frequency of the alkali metal vapor. The system also includes a detection system configured to detect the precession of the alkali metal vapor in response to a detection beam corresponding to the optical probe beam exiting the sensor cell and to calculate an amplitude and direction of the external magnetic field based on the detected precession of the alkali metal vapor.

Another example includes a method for measuring an external magnetic field via a magnetometer system. The method includes generating a circularly-polarized optical pump beam via a pump laser and generating a linearly-polarized optical probe beam via a probe laser. The method also includes providing the circularly-polarized optical pump beam through a sensor cell comprising alkali metal vapor in a pulsed-manner based on a timing signal to facilitate precession of the alkali metal vapor in response to an external magnetic field. The method also includes providing the linearly-polarized optical probe beam through the sensor cell in a pulsed-manner based on the timing signal to provide a detection beam corresponding to the linearly-polarized optical probe beam exiting the sensor cell. The method also includes detecting the precession of the alkali metal vapor based on the detection beam and generating the timing signal based on the detected precession of the alkali metal vapor. The method further includes calculating an amplitude and direction of the external magnetic field based on the detected precession of the alkali metal vapor.

Another example includes a magnetometer system. The system includes a sensor cell comprising alkali metal vapor and comprising a first measurement zone, a second measurement zone, and a third measurement zone. The second and third measurement zones can be arranged at opposite ends of the sensor cell. The system also includes a laser system configured to provide an optical pump beam through each of the first, second, and third measurement zones of the sensor cell in a pulsed manner to facilitate precession of the alkali metal vapor in response to an external magnetic field and to provide an optical probe beam through each of the first, second, and third measurement zones of the sensor cell in a pulsed manner based on a precession frequency of the alkali metal vapor. The system further includes a detection system configured to detect the precession of the alkali metal vapor in response to a first detection beam, a second detection beam, and a third detection beam corresponding to the optical probe beam exiting the sensor cell through the first, second, and third measurement zones, respectively, to calculate a scalar amplitude and direction of the external magnetic field in response to the first detection beam, and to calculate a magnetic field gradient of the external magnetic field in response to the second and third detection beams.

BRIEF DESCRIPTION OF THE DRAWINGS

FIG. 1 illustrates an example of a magnetometer system.

FIG. 2 illustrates an example diagram of an external magnetic field through a sensor cell.

DETAILED DESCRIPTION

Figure 3:
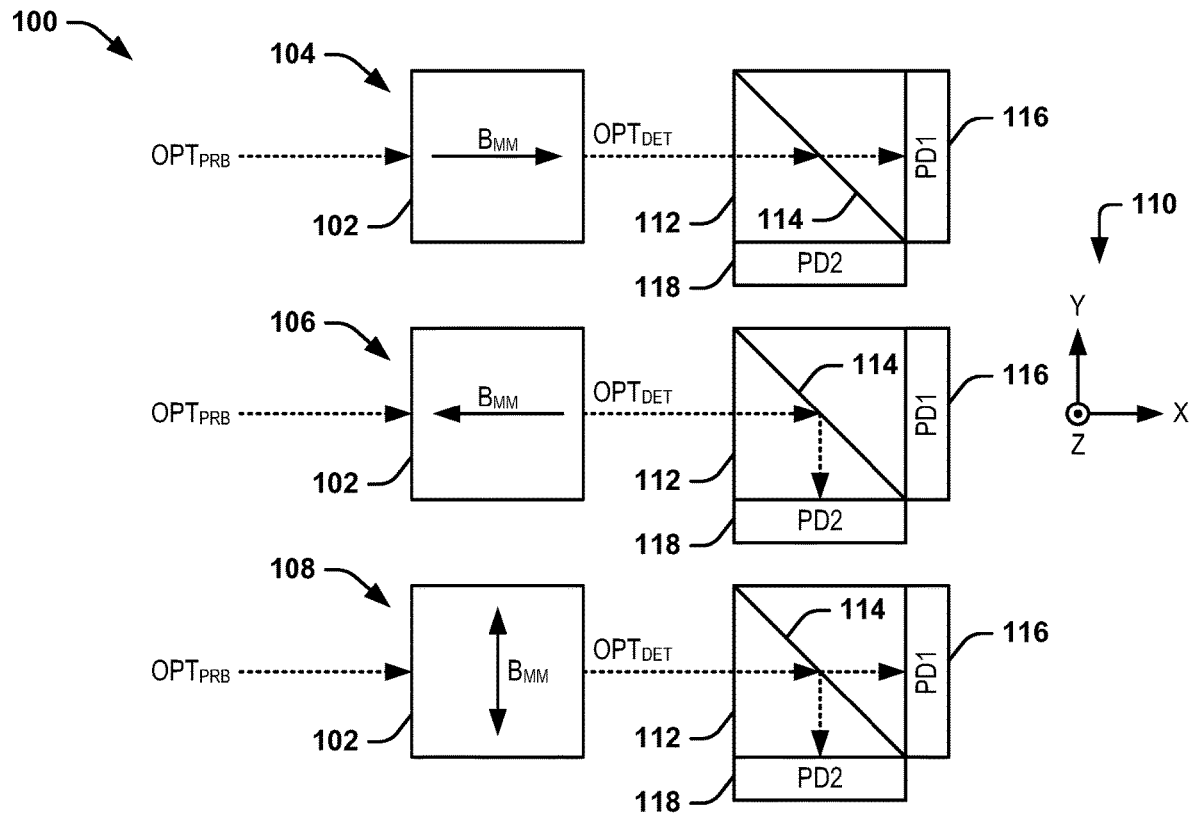
FIG. 3 illustrates an example diagram of interrogation of a sensor cell.

This disclosure relates generally to sensor systems, and more specifically to a pulsed-beam atomic magnetometer. The magnetometer system can be configured as a Synchronous Light-pulse Atomic Magnetometer (SLAM) system that includes a concurrent pump/pulse beam pumping and interrogation methodology, such as similar to Bell-Bloom all-optical magnetometry. The magnetometer system includes a laser system that includes at least one pump laser and at least one probe laser configured to generate a respective at least one optical pump beam and a respective at least one optical probe beam. As an example, the pump and optical probe beam(s) can be combined via an optical combiner (e.g., a 2×2 optical combiner) to provide the pump and optical probe beam(s) in a collinear manner. The pump and optical probe beam(s) are provided through a sensor cell that includes an alkali metal vapor. The alkali metal vapor can precess in response to an external magnetic field based on alignment of the net magnetic moments of the alkali metal vapor in the cell in response to the circularly-polarized optical pump beam. As a result of the precession, the linearly-polarized optical probe beam can experience a Faraday rotation as it passes through the sensor cell, with the Faraday rotation being based on the instantaneous orientation of the net magnetic moments of the alkali metal vapor as the alkali metal vapor precesses. Therefore, detection beam(s) corresponding to the optical probe beam(s) exiting the sensor cell can be monitored to monitor the precession of the alkali metal vapor.

As an example, the monitored precession of the alkali metal vapor can be provided as feedback to a timing controller to generate a timing signal. The timing signal can thus be provided to the laser system to provide a timing reference as to when to provide the pulsed optical pump beam and optical probe beam through the sensor cell. For example, the laser system can provide an optical pump beam pulse through the sensor cell in response to the timing signal to pump the alkali metal vapor once each period of the precession (e.g., when the magnetic moments are aligned approximately parallel with the optical pump beam axis). As another example, the laser system can provide an optical probe beam pulse through the sensor cell in response to the timing signal when the magnetic moments of the alkali metal vapor are approximately parallel and anti-parallel with the optical probe beam axis to calibrate the magnetometer system. Furthermore, the laser system can provide an optical probe beam pulse through the sensor cell in response to the timing signal when the magnetic moments of the alkali metal vapor are approximately orthogonal with the optical probe beam axis to monitor the amplitude and direction of the external magnetic field, as indicated by the Faraday rotation of the linear polarization.

Furthermore, the sensor cell can include three distinct measurement zones through which the optical pump beam and optical probe beam can be provided. The first measurement zone can be through an approximate center of the sensor cell, such that the timing signal can be generated based on the respective detection beam that is provided from the first measurement zone. The detection beam provided from the first measurement zone can also determine a scalar amplitude and direction of the external magnetic field. In addition, the second and third measurement zones can be arranged at regions of substantially opposite ends of the sensor cell. As a result, a second detection beam corresponding to the optical probe beam exiting the sensor cell through the second measurement zone and a third detection beam corresponding to the optical probe beam exiting the sensor cell through the third measurement zone can be implemented to determine a magnetic field gradient of the external magnetic field based on a differential measurement of the magnetic field through each of the second and third measurement zones.

FIG. 1 illustrates an example of a magnetometer system 10. The magnetometer system 10 can be implemented in any of a variety of applications to measure a magnetic field, such as navigation. For example, the magnetometer system 10 can be implemented in an inertial navigation system (INS) for an aircraft or a spacecraft to assist with real-time navigation or location determination.

The magnetometer system 10 includes a laser system 12 that includes at least one pump laser 14 and at least one probe laser 16. The pump laser(s) 14 are each configured to generate a respective optical pump beam $OPT_{PMP}$, and the probe laser(s) 16 are each configured to generate a respective optical probe beam $OPT_{PRB}$. The optical pump beam(s) $OPT_{PMP}$ and the optical probe beam(s) $OPT_{PRB}$ are each provided through a sensor cell 18 that includes an alkali metal vapor disposed therein. In the example of FIG. 1, the sensor cell 18 includes a first measurement zone 20 ("ZONE 1"), a second measurement zone 22 ("ZONE 2"), and a third measurement zone 24 ("ZONE 3") that can each correspond to three-dimensional spatial regions within the volume of the sensor cell 18. As an example, the first measurement zone 20 can be arranged approximately centrally along a length of the sensor cell 18, and the second and third measurement zones 22 and 24 can be arranged at opposing ends of the sensor cell 18. As described in greater detail herein, the first, second, and third measurement zones 20, 22, and 24 can be implemented for calibration of the magnetometer system 10, for determining the amplitude and direction of an external magnetic field, for determining a magnetic field gradient associated with the external magnetometer, and for feedback to generate a timing signal associated with the precession of the alkali metal vapor.

The optical pump beam $OPT_{PMP}$ can be provided through the sensor cell 18 to facilitate precession of the alkali metal vapor in response to the external magnetic field. As an example, the optical pump beam $OPT_{PMP}$ can be circularly-polarized, such that the angular momentum of the photons of the optical pump beam $OPT_{PMP}$ can be absorbed by the alkali metal vapor (e.g., based on the wavelength of the optical pump beam $OPT_{PMP}$). Therefore, the optical pump beam $OPT_{PMP}$ can align the magnetic moment of the alkali metal vapor in an approximately parallel manner with respect to the optical pump beam $OPT_{PMP}$. Therefore, the alkali metal vapor can precess about the external magnetic field based on the alignment of the magnetic moment of the alkali metal vapor.

FIG. 2 illustrates an example diagram 50 of an external magnetic field $B_{EXT}$ through a sensor cell 52. In the example of FIG. 2, the sensor cell is demonstrated in a first view 54 and a second view 56 that are orthogonal with respect to each other. Particularly, the first view 54 is demonstrated from a view along the Z-axis based on Cartesian coordinate system 58, and the second view 56 is demonstrated from a view along the Y-axis based on Cartesian coordinate system 60. The sensor cell 52 can correspond to the sensor cell 18 in the example of FIG. 1. Therefore, reference is to be made to the example of FIG. 1 in the following description of the example of FIG. 2.

In the example of FIG. 2, an external magnetic field $B_{EXT}$ is demonstrated as being provided orthogonally through the sensor cell 52 in the −Z direction. The sensor cell 52 is also demonstrated as including the alkali metal vapor arranged as having a magnetic moment vector $B_{MM}$ that extends along the X-axis. The magnetic moment vector $B_{MM}$ can correspond to a parallel arrangement of the magnetic moment of the alkali metal vapor in response to being pumped by the optical pump beam $OPT_{PMP}$. As an example, the optical pump beam $OPT_{PMP}$ can be periodically provided in a pulsed manner to periodically align the magnetic moment vector $B_{MM}$ parallel (e.g., collinear and in the same direction) with the optical pump beam $OPT_{PMP}$.

In response to the external magnetic field $B_{EXT}$ through the sensor cell 52, the magnetic moment of the alkali metal vapor can precess about the external magnetic field $B_{EXT}$. In the example of FIG. 2, because the external magnetic field $B_{EXT}$ is provided orthogonally through the sensor cell 52, and thus orthogonally with respect to the magnetic moment vector $B_{MM}$, the magnetic moment vector $B_{MM}$ can precess clockwise in the XY-plane, and thus orthogonally with respect to the external magnetic field $B_{EXT}$. The amplitude of the external magnetic field $B_{EXT}$ can determine the frequency of precession of the magnetic moment vector $B_{MM}$. In addition, as described in greater detail herein, the angle of the external magnetic field $B_{EXT}$ with respect to the angle of the magnetic moment vector $B_{MM}$ can affect the angle of the magnetic moment vector $B_{MM}$ during a period of precession. The angle of the magnetic moment vector $B_{MM}$ can thus be detected by the magnetometer system, as described in greater detail herein, and can be indicative of the angle of the external magnetic field $B_{EXT}$.

Referring back to the example of FIG. 1, the magnetometer system 10 can also include a detection system 26. The detection system 26 is configured to monitor at least one detection beam $OPT_{DET}$ that is provided from the sensor cell 18. As an example, the detection beam(s) $OPT_{DET}$ can correspond to the optical probe beam $OPT_{PRB}$ being provided through at least one of the respective measurement zones 20, 22, and 24 and exiting the sensor cell 18. As described previously, the optical probe beam $OPT_{PRB}$ can be provided as linearly-polarized. Therefore, based on the precession of the magnetic moment vector $B_{MM}$ of the alkali metal vapor, the optical probe beam $OPT_{PRB}$ can experience Faraday rotation, such that the respective detection beam(s) $OPT_{DET}$ can exhibit the Faraday rotation that can be indicative of the precession of the alkali metal vapor based on the external magnetic field $B_{EXT}$.

In the example of FIG. 1, the detection system 26 includes at least one optical detector 28 that is configured to detect the Faraday rotation of the respective detection beam(s) $OPT_{DET}$ to monitor the precession of the alkali metal vapor in response to the external magnetic field $B_{EXT}$. As an example, the optical detector(s) 28 can be configured as an polarization beamsplitter and set of photodetectors (e.g., photodiodes) that can measure a relative Faraday rotation of the detection beam(s) $OPT_{DET}$. Therefore, based on the measured Faraday rotation of the detection beam(s) $OPT_{DET}$, the detection system 26 can calculate an amplitude and direction of the external magnetic field $B_{EXT}$, as described in greater detail herein. In the example of FIG. 1, the detection system 26 is demonstrated as calculating a scalar amplitude and direction of the external magnetic field $B_{EXT}$, demonstrated as a signal $B_{SCLR}$, and as calculating a magnetic field gradient of the external magnetic field $B_{EXT}$, demonstrated as a signal $B_{GRDT}$.

In the example of FIG. 1, the detection system 26 also includes a timing controller 30. As described previously, the laser system 12 can provide the optical pump beam $OPT_{PMP}$ via the pump laser 14 in a pulsed manner, and can likewise provide the optical probe beam $OPT_{PRB}$ via the probe laser 16 in a pulsed manner. The laser system 12 can provide the pulses of the optical pump beam $OPT_{PMP}$ and the optical probe beam $OPT_{PRB}$ in response to a timing signal TMR that is generated by the timing controller 30 in response to the detection beam(s) $OPT_{DET}$. For example, the timing signal TMR can correspond to the period of the precession of the alkali metal vapor, such that the timing signal TMR can provide an indication to the laser system 12 as to the time to activate the pump laser(s) 14 to provide the pulse(s) of the optical pump beam $OPT_{PMP}$ and as to the time to activate the probe laser(s) 16 to provide the pulses(s) of the optical probe beam $OPT_{PRB}$.

FIG. 3 illustrates an example diagram 100 of interrogation of a sensor cell 102. In the example of FIG. 3, the diagram 100 includes three separate states of the sensor cell 102, demonstrated as a first state 104, a second state 106, and a third state 108. The sensor cell 102 can correspond to the sensor cell 18 in the example of FIG. 1, and the sensor cell 52 in the example of FIG. 2. As an example, the sensor cell 102 can correspond to a given one of the measurement zones 20, 22, and 24 in the sensor cell 18 demonstrated in the example of FIG. 1. Therefore, reference is to be made to the example of FIGS. 1 and 2 in the following description of the example of FIG. 3.

Each of the states 104, 106, and 108 of the sensor cell 102 correspond to separate respective orientations of the magnetic moment vector $B_{MM}$ of the alkali metal vapor during a portion of the precession of the alkali metal vapor in response to the external magnetic field $B_{EXT}$ (not shown in the example of FIG. 3). The first state 104 demonstrates the magnetic moment vector $B_{MM}$ extending in the +X direction based on the Cartesian coordinate system 110, which can correspond to a direction parallel to the optical probe beam $OPT_{PRB}$. As an example, the optical probe beam $OPT_{PRB}$ and the optical pump beam $OPT_{PMP}$ can be collinear, such that the first state 104 can demonstrate the magnetic moment vector $B_{MM}$ extending parallel with both the optical probe beam $OPT_{PRB}$ and the optical pump beam $OPT_{PMP}$. As an example, the first state 104 can correspond to a beginning of a precession period of the magnetic moment vector $B_{MM}$, such that the timing signal TMR can command the laser system 12 to provide a pulse of the optical pump beam $OPT_{PMP}$ via the pump laser 14 to align the alkali metal vapor to form the magnetic moment vector $B_{MM}$.

In the first state 104, the optical probe beam $OPT_{PRB}$ is demonstrated as being provided through the sensor cell 102 to provide a detection beam $OPT_{DET}$ exiting the sensor cell 102 and being provided to an optical detector 112. As an example, the optical detector 112 can correspond to an optical detector 28 in the example of FIG. 1. The optical detector 112 includes a polarization beamsplitter 114, a first photodetector ("PD1") 116, and a second photodetector ("PD2") 118. In the example of FIG. 3, the detection beam $OPT_{DET}$ can exhibit a substantial maximum Faraday rotation in a first direction about the magnetic moment vector $B_{MM}$ based on the optical probe beam $OPT_{PRB}$ being provided through the sensor cell 102 parallel with the magnetic moment vector $B_{MM}$. As a result, the detection beam $OPT_{DET}$ can pass preferentially through the polarization beamsplitter 114 to the first photodetector 116. As a result, the detection system 26 in the example of FIG. 1 can identify an approximate magnitude of the magnetic moment vector $B_{MM}$ at the beginning of a precession period of the precession of the alkali metal vapor. For example, the timing signal TMR can command the laser system 12 to provide a calibration pulse of the optical probe beam $OPT_{PRB}$ via the probe laser 16 to determine an approximate magnitude of the magnetic moment vector $B_{MM}$ and to determine if the magnetic moment vector $B_{MM}$ is parallel with the optical probe beam $OPT_{PRB}$.

The second state 106 demonstrates the magnetic moment vector $B_{MM}$ extending in the -X direction based on the Cartesian coordinate system 110, which can correspond to a direction anti-parallel to the optical probe beam $OPT_{PRB}$. As an example, the second state 106 can correspond to an approximately 180° phase of the precession period of the magnetic moment vector $B_{MM}$. In the second state 106, the optical probe beam $OPT_{PRB}$ is demonstrated as being provided through the sensor cell 102 to provide a detection beam $OPT_{DET}$ exiting the sensor cell 102 and being provided to the optical detector 112. In the example of FIG. 3, the detection beam $OPT_{DET}$ can exhibit an approximate maximum Faraday rotation in a second direction opposite the first direction based on the optical probe beam $OPT_{PRB}$ being provided through the sensor cell 102 anti-parallel with the magnetic moment vector $B_{MM}$. As a result, the detection beam $OPT_{DET}$ can be preferentially reflected by the polarization beamsplitter 114 to the second photodetector 118. As a result, the detection system 26 in the example of FIG. 1 can identify that the magnetic moment vector $B_{MM}$ is at the time during the precession period of the precession of the alkali metal vapor that the magnetic moment vector $B_{MM}$ is anti-parallel with respect to the optical probe beam $OPT_{PRB}$ and can determine an approximate magnitude of the magnetic moment vector $B_{MM}$ at the 180° phase in the precession cycle. For example, the timing signal TMR can command the laser system 12 to provide a calibration pulse of the optical probe beam $OPT_{PRB}$ via the probe laser 16 to determine if the magnetic moment vector $B_{MM}$ is anti-parallel with the optical probe beam $OPT_{PRB}$ and measure its magnitude.

The third state 108 demonstrates the magnetic moment vector $B_{MM}$ extending in either the +Y direction or -Y direction based on the Cartesian coordinate system 110, which can correspond to directions orthogonal to the optical probe beam $OPT_{PRB}$. As an example, the third state 106 can correspond to either approximately 90° phase or 270° phase of the precession period of the magnetic moment vector $B_{MM}$. In the third state 108, the optical probe beam $OPT_{PRB}$ is demonstrated as being provided through the sensor cell 102 to provide a detection beam $OPT_{DET}$ exiting the sensor cell 102 and being provided to the optical detector 112. In the example of FIG. 3, the detection beam $OPT_{DET}$ can exhibit an approximate zero Faraday rotation based on the optical probe beam $OPT_{PRB}$ being provided through the sensor cell 102 orthogonally with the magnetic moment vector $B_{MM}$. As a result, the detection beam $OPT_{DET}$ can be partially (e.g., half) reflected by the polarization beamsplitter 114, and thus provided approximately equally to each of the first photodetector 116 and the second photodetector 118. As a result, the detection system 26 in the example of FIG. 1 can identify that the magnetic moment vector $B_{MM}$ is at the time during the precession period of the precession of the alkali metal vapor that the magnetic moment vector $B_{MM}$ is approximately orthogonal with respect to the optical probe beam $OPT_{PRB}$. For example, the timing signal TMR can command the laser system 12 to provide a measurement pulse of the optical probe beam $OPT_{PRB}$ via the probe laser 16 to determine if the magnetic moment vector $B_{MM}$ is orthogonal to the optical probe beam $OPT_{PRB}$.

Therefore, based on the states 104, 106, and 108 demonstrated in the example of FIG. 3, the detection system 26 can monitor the detection beam $OPT_{DET}$ at the appropriate times in a feedback manner based on the timing signal TMR to monitor the precession of the alkali metal vapor, and thus to determine the amplitude and direction of the external magnetic field $B_{EXT}$. As an example, upon initialization of the magnetometer system 10, the detection system 26 can command the laser system 12 to provide the optical probe beam $OPT_{PRB}$ substantially continuously through the first measurement zone 20 of the sensor cell 18 to determine an initial precession of the alkali metal vapor in the sensor cell 18 in response to the external magnetic field $B_{EXT}$. For example, the detection system 26 can generate a waveform based on a differential measurement between the first photodetector 116 and the second photodetector 118 to determine an initial frequency of the precession of the external magnetic field $B_{EXT}$, which can correspond to the amplitude of the external magnetic field $B_{EXT}$. In addition, the initial precession can also indicate the portions of the precession that correspond to the anti-parallel orientation of the magnetic moment of the alkali metal vapor, such as demonstrated in the second state 106 in the example of FIG. 3, and the portions of the precession that correspond to the orthogonal orientations of the magnetic moment of the alkali metal vapor, such as demonstrated in the third state 108 in the example of FIG. 3. The relative offset of the timing of the second and third states 106 and 108, respectively, can be indicative of the angle of the external magnetic field $B_{EXT}$, as described in greater detail herein.

In response to determining the initial precession of the alkali metal vapor, the timing controller 30 can generate the timing signal TMR based on the initial precession of the alkali metal vapor. The detection system 26 can thus cease the substantially constant application of the optical probe beam $OPT_{PRB}$, such that the laser system 12 can provide the optical pump beam $OPT_{PMP}$ pulses via the pump laser 14 and the optical probe beam $OPT_{PRB}$ pulses via the probe laser 16 based on the timing signal TMR. As a result, the detection system 26 can monitor the detection beam $OPT_{DET}$ from the first measurement zone 20 to monitor the precession of the alkali metal vapor based on observing the detection beam $OPT_{DET}$ in the third state 108. As an example, in response to detecting an uneven amplitude of the detection beam $OPT_{DET}$ with respect to the first and second photodetectors 116 and 118, the detection system 26 can identify that the external magnetic field $B_{EXT}$ has changed in amplitude and/or direction based on the precession of the alkali metal vapor being misaligned from the application of the optical probe beam $OPT_{PRB}$ pulse in response to the timing signal TMR. Therefore, the detection system 26 can identify the change in the external magnetic field $B_{EXT}$ (e.g., providing the measured magnetic field $B_{SCLR}$ appropriately), and the timing controller 30 can change the timing signal TMR accordingly.

As described previously, the first state 104 can correspond to the alignment of the magnetic moment vector $B_{MM}$ in response to the optical pump beam $OPT_{PMP}$ pulse. However, as also described previously, the precession of the magnetic moment of the alkali metal vapor is provided about the direction of the external magnetic field $B_{EXT}$. Therefore, the precession of the alkali metal vapor may not necessarily be planar with respect to the XY-plane, as demonstrated in the examples of FIGS. 2 and 3. Therefore, the relative timing of the second and third states 106 and 108 may not necessarily correspond to 180° of the precession period for the second state and 90° and 270° of the precession period for the third state 108.

Figure 4:
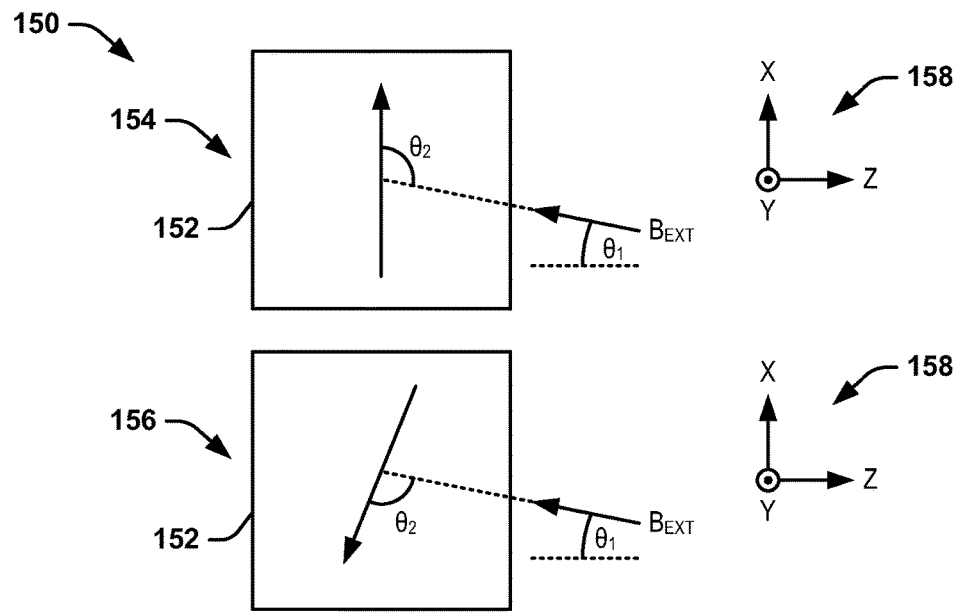
FIG. 4 illustrates another example diagram of an external magnetic field through a sensor cell.

FIG. 4 illustrates another example diagram 150 of an external magnetic field $B_{EXT}$ through a sensor cell 152. In the example of FIG. 4, the sensor cell is demonstrated in a first view 154 and a second view 156 that are orthogonal with respect to each other. Particularly, each of the first view 154 and second view 156 are demonstrated from a view along the Y-axis based on Cartesian coordinate system 158. The sensor cell 152 can correspond to the sensor cell 18 in the example of FIG. 1. Therefore, reference is to be made to the example of FIGS. 1-3 in the following description of the example of FIG. 4.

The sensor cell 152 is demonstrated as including the alkali metal vapor arranged as having a magnetic moment vector $B_{MM}$ that extends along the X-axis. Similar to as described previously, the magnetic moment vector $B_{MM}$ can correspond to a parallel arrangement of the magnetic moment of the alkali metal vapor in response to being pumped by the optical pump beam $OPT_{PMP}$. As an example, the optical pump beam $OPT_{PMP}$ can be periodically provided in a pulsed manner to periodically align the magnetic moment vector $B_{MM}$ parallel (e.g., collinear and in the same direction) with the optical pump beam $OPT_{PMP}$. In the example of FIG. 4, an external magnetic field $B_{EXT}$ is demonstrated as being provided through the sensor cell 152 at an angle $\theta_1$ relative to the −Z axis, and thus provides an angle of $\theta_2$ relative to the magnetic moment vector $B_{MM}$, wherein $\theta_2$ minus $\theta_1$ is equal to approximately 90°.

In response to the external magnetic field $B_{EXT}$ through the sensor cell 152, the magnetic moment of the alkali metal vapor can precess about the external magnetic field $B_{EXT}$. In the example of FIG. 4, because the external magnetic field $B_{EXT}$ is provided at the angle $\theta_1$ through the sensor cell 152, the magnetic moment vector $B_{MM}$ can precess at the angle $\theta_2$ about the external magnetic field $B_{EXT}$. In the example of FIG. 2, the second view 156 can thus demonstrate the magnetic moment vector $B_{MM}$ at a portion of the precession that is opposite the portion of the precession demonstrated in the first view 154 (e.g., at 180° out-of-phase during the precession of the magnetic moment vector $B_{MM}$). In addition, it is to be understood that the magnetic moment vector $B_{MM}$ will not be collinear with the Y-axis during the 90° and 270° phases of the precession of the alkali metal vapor, but will instead be angularly offset from the Y-axis based on the angle $\theta_1$ of the external magnetic field $B_{EXT}$ relative to the Z-axis. As a result, the measured amplitude of the external magnetic field $B_{EXT}$ will not be symmetrical about zero at each 180° phase interval of the precession period of the alkali metal vapor, as described in greater detail herein with reference to FIG. 5.

Figure 5:
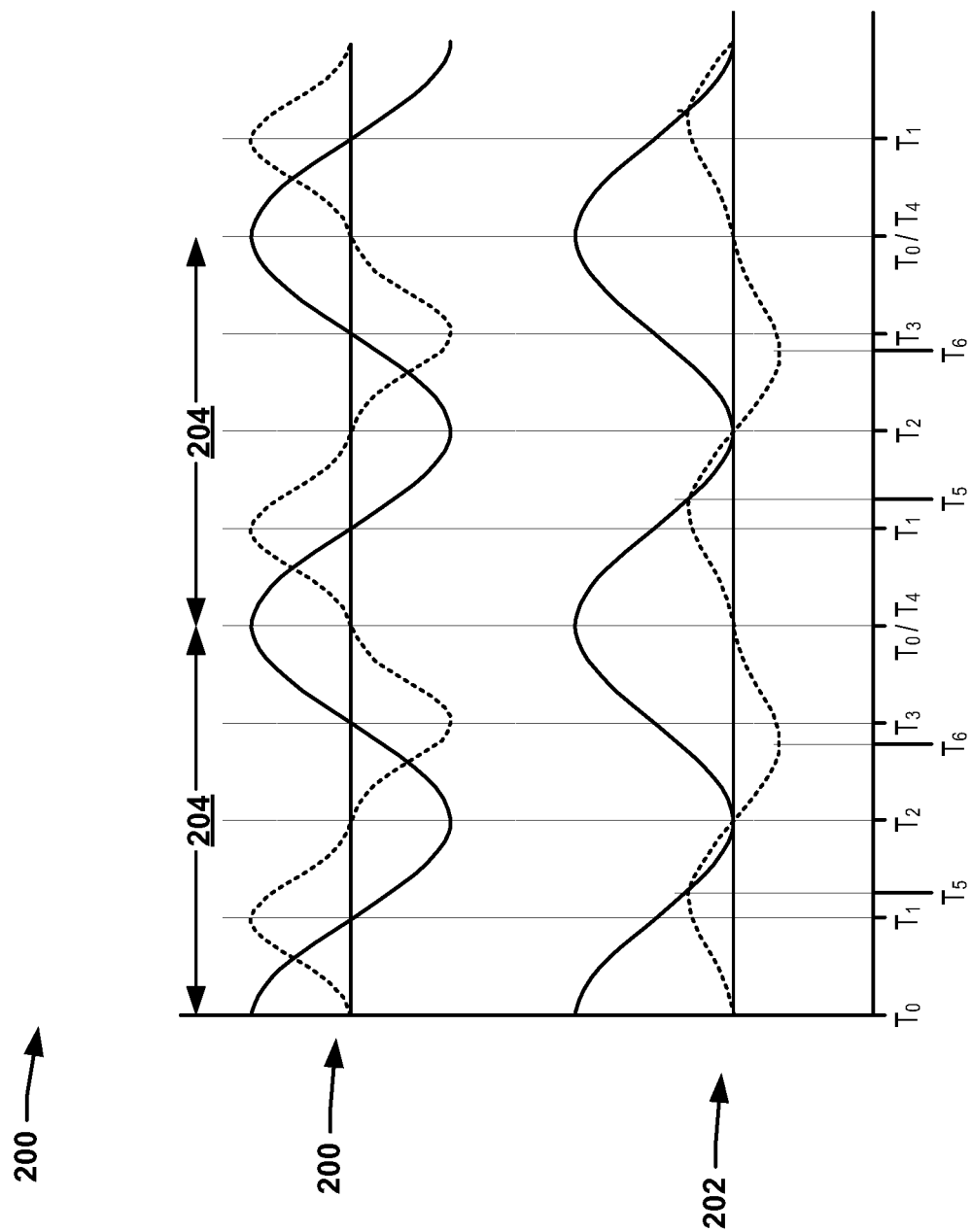
FIG. 5 illustrates an example of a timing diagram.

FIG. 5 illustrates an example of timing diagrams 200 and 202. The timing diagram 200 can correspond to a precession of the alkali metal vapor based on the external magnetic field $B_{EXT}$ being provided orthogonally with respect to the axis of the optical probe beam $OPT_{PRB}$, and thus along the −Z axis, as demonstrated in the example of FIG. 2. The timing diagram 200 demonstrates the spin projection of the magnetic moment vector $B_{MM}$ along the optical probe beam $OPT_{PRB}$ as a solid line. The timing diagram 200 further demonstrates the relative sensitivity of measurement of gradients in the amplitude of the external magnetic field $B_{EXT}$ as a function of the direction of the magnetic moment vector $B_{MM}$, and thus based on the optical detector(s) 28 as a function of the Faraday rotation of the detection beam(s) $OPT_{DET}$, as a dotted line.

Similarly, the timing diagram 202 can correspond to a precession of the alkali metal vapor based on the external magnetic field $B_{EXT}$ being provided at an angle $\theta_1=45°$ with respect to the axis of the optical pump beam $OPT_{PMP}$, and thus such that the angle $\theta_2=45°$, similar to as demonstrated in the example of FIG. 4 (whereas the angles $\theta_1$ and $\theta_2$ are not necessarily illustrated to scale). The timing diagram 202 demonstrates the spin projection of the magnetic moment vector $B_{MM}$ along the optical probe beam $OPT_{PRB}$ as a solid line. The timing diagram 202 further demonstrates the relative sensitivity of measurement of gradients in the amplitude of the external magnetic field $B_{EXT}$ as a function of the magnetic moment vector $B_{MM}$, and thus based on the optical detector(s) 28 as a function of the Faraday rotation of the detection beam(s) $OPT_{DET}$, as a dotted line.

In the example of FIG. 5, the periods of the precession of the magnetic moment vector $B_{MM}$ are demonstrated at intervals 204, beginning at a time $T_0$. Particularly, at a time $T_0$ of each precession period, the laser system 12 can provide a pulse of the optical pump beam $OPT_{PMP}$ to align the magnetic moment vector $B_{MM}$ along the axis of the optical pump beam $OPT_{PMP}$. Subsequently, the magnetic moment vector $B_{MM}$ precesses about the external magnetic field $B_{EXT}$. A time $T_1$ corresponds to 90° of the precession period, a time $T_2$ corresponds to 180° of the precession period, a time $T_3$ corresponds to 270° of the precession period, and a time $T_4$ corresponds to completion of the precession period and the beginning of a next precession period. Thus, at the time $T_4$, the laser system 12 can again provide a pulse of the optical pump beam $OPT_{PMP}$ to align the magnetic moment vector $B_{MM}$ along the axis of the optical pump beam $OPT_{PMP}$.

In addition, similar to as described previously, the laser system 12 can provide pulses of the optical probe beam $OPT_{PRB}$ to calibrate the magnetometer system 10. As an example, the laser system 12 can provide pulses of the optical probe beam $OPT_{PRB}$ at the time $T_0$ and the time $T_2$, and thus at 180° opposite phases of the precession of the alkali metal vapor, to calibrate the magnetometer system 10. As an example, the calibration pulses of the optical probe beam $OPT_{PRB}$ can correspond to the timing of the first state 104 and the second state 106 demonstrated in the example of FIG. 3.

For example, the calibration pulses of the optical probe beam $OPT_{PRB}$ can be substantially reduced in optical energy relative to interrogation pulses intended to measure the amplitude of the external magnetic field $B_{EXT}$ and gradients therein, as described in greater detail herein. Therefore, in response to the calibration pulse provided at the time $T_0/T_4$, the optical detector(s) 112 can determine that the optical energy of the detection beam $OPT_{DET}$ is provided preferentially on either the first photodetector 116 or the second photodetector 118. Similarly, in response to the calibration pulse provided at the time $T_2$, the optical detector(s) 112 can determine that the optical energy of the detection beam $OPT_{DET}$ is provided preferentially on the other of the first photodetector 116 and the second photodetector 118. The laser system 12 can also provide measurement pulses of the optical probe beam $OPT_{PRB}$ at times $T_1$ and $T_3$ in the example of timing diagram 200 or times $T_2$, $T_5$ and $T_6$ in the example of timing diagram 202. These measurement pulses can be of a substantially higher magnitude than the optical probe beam $OPT_{PRB}$ pulses provided during times $T_0/T_4$ and $T_2$. If the detection system 26 determines that the optical energy of detection beam $OPT_{DET}$ is shared unequally between the first and second photodetectors 116 and 118 during a measurement pulse of the optical probe beam $OPT_{PRB}$ at time $T_1$ or $T_3$ in the example of timing diagram 200 or $T_2$ in the example of timing diagram 202, the timing controller 28 can adjust the timing signal TMR accordingly in a feedback manner. Changes to the sharing of optical energy of the detection beam $OPT_{DET}$ on the photodetectors 116 and 118 can indicate a change in amplitude of the external magnetic field $B_{EXT}$, given that the amplitude of the external magnetic field $B_{EXT}$ affects the frequency of the precession of the alkali metal vapor, and thus the length of the precession period of the alkali metal vapor.

The timing diagram 200 thus demonstrates a sinusoidal spin projection of the magnetic moment vector $B_{MM}$ about zero based on the planar precession of the magnetic moment vector $B_{MM}$, as demonstrated in the example of FIG. 2. Additionally, because the precession of the magnetic moment vector $B_{MM}$ is planar in the example of FIG. 2 based on the external magnetic field $B_{EXT}$ being orthogonal to the axis of the optical probe beam $OPT_{PRB}$, the external magnetic field $B_{EXT}$, as observed by the optical detector(s) 28 via the detection beam(s) $OPT_{DET}$, is symmetrical about zero at each 180° interval of the period of the precession. The laser system 12 can be configured to provide the pulses of the optical probe beam $OPT_{PRB}$ at the times corresponding to an approximately equal optical energy of the detection beam $OPT_{DET}$ is provided on the first and second photodetectors 116 and 118 of the optical detector(s) 112 to determine the angle of the external magnetic field $B_{EXT}$.

For the timing diagram 200, in which the external magnetic field $B_{EXT}$ is provided orthogonally with respect to the optical axis of the optical probe beam $OPT_{PRB}$, the time during the precession of the alkali metal vapor at which approximately equal optical energy of the detection beam $OPT_{DET}$ is provided on the first and second photodetectors 116 and 118 of the optical detector(s) 112 corresponds to third state 108 in the example of FIG. 3 (e.g., at both 90° and 270°). Therefore, the laser system 12 can provide the optical probe beam $OPT_{PRB}$ pulses at the times $T_1$ and $T_3$ in the timing diagram 200 to monitor the magnitude and angle of the external magnetic field $B_{EXT}$. Deviations of the angle and/or amplitude of the external magnetic field $B_{EXT}$ can thus be observed by the detection system 26 in response to the optical energy of the detection beam $OPT_{DET}$ provided on the first and second photodetectors 116 and 118 of the optical detector(s) 112 being unequal, as described in greater detail in the timing diagram 202.

Similar to the timing diagram 200, the timing diagram 202 demonstrates a sinusoidal spin projection of the magnetic moment vector $B_{MM}$. However, because of the angle $\theta_1=45°$, the spin projection of the magnetic moment vector $B_{MM}$ along the direction of the optical probe beam $OPT_{PRB}$ is tangent to zero at the time $T_2$ in the timing diagram 202, corresponding to the 180° precession period being provided along the –Z axis, and thus orthogonal to the 0° precession period. However, because the precession of the magnetic moment vector $B_{MM}$ is conical, and not planar in the example of FIG. 4 based on the external magnetic field $B_{EXT}$ being offset of orthogonal with respect to the optical axis of the optical probe beam $OPT_{PRB}$ by $\theta_1=45°$, the external magnetic field $B_{EXT}$, as observed by the optical detector(s) 28 via the detection beam(s) $OPT_{DET}$, is asymmetrical about zero at each 180° interval of the period of the precession. Because the precession of the alkali metal vapor is non-planar, the time at which the detection beam $OPT_{DET}$ provides approximately equal optical energy on the photodetectors 116 and 118 of the optical detector(s) 112 is not aligned with the times $T_1$ and $T_3$, as opposed to in the timing diagram 200. Furthermore, in the timing diagram 202, the time at which the detection beam $OPT_{DET}$ provides approximately maximum sensitivity to magnetic field gradients at a time $T_5$ between the time $T_1$ and the time $T_2$, and again at a time $T_6$ between the times $T_2$ and $T_3$. In the example of FIG. 5, the time $T_5$ occurs just subsequent to the time $T_1$, and the time $T_6$ occurs just preceding the time $T_3$. Therefore, the times $T_5$ and $T_6$ are not 180° out-of-phase of each other in the precession period of the alkali metal vapor.

As an example, the detection system 26 can provide the optical probe beam pulses $OPT_{PRB}$ at the appropriate times at which the optical energy of the detection beam $OPT_{DET}$ provided on the first and second photodetectors 116 and 118 is approximately equal based on the timing signal TMR. In response to determining that the optical energy of the detection beam $OPT_{DET}$ provided on the first and second photodetectors 116 and 118 is unequal, the detection beam $OPT_{DET}$ can determine that the angle or the amplitude of the external magnetic field $B_{EXT}$ through the sensor cell 14 is changing. As a result, the timing controller 30 can change the timing signal TMR to modify the times at which the laser system 12 provides the optical probe beam $OPT_{PRB}$ pulses to measure the angle of the external magnetic field $B_{EXT}$, such as to set the detection beam $OPT_{DET}$ to have approximately equal optical energy of the detection beam $OPT_{DET}$ provided on the first and second photodetectors 116 and 118. Accordingly, in this manner, the detection system 26 can monitor the angle and frequency of the external magnetic field $B_{EXT}$ in a feedback manner.

Therefore, as described herein, the magnitude of the external magnetic field $B_{EXT}$ is determined by the period of the precession of the alkali metal vapor and the angle of the external magnetic field $B_{EXT}$ is determined by the relative timing of orthogonality of the spin projection of the magnetic moment vector $B_{MM}$ along the optical probe beam $OPT_{PRB}$, and thus the zero-crossings of the solid lines during the respective period as demonstrated in the example of FIG. 5. The laser system 12 can thus provide measurement pulses of the probe beam $OPT_{PRB}$ at respective times when the zero-crossings are expected to occur by the detection system 26 based on monitoring the timing of the zero-crossings during previous measurements. As an example, the measurement pulses of the optical probe beam $OPT_{PRB}$ can be provided at a much higher optical power than the calibration pulses to obtain a highly sensitive measurement of whether the timing of the zero-crossings has deviated from that of the previously monitored measurements, such that corrections can be provided accordingly by the detection system 26 (e.g., via the timing controller 30).

As an example, if the magnitude of the external magnetic field $B_{EXT}$ has changed, more optical power of the respective detection beam $OPT_{DET}$ is observed on either the first photodiode 116 or the second photodiode 118, depending on whether the external magnetic field $B_{EXT}$ has increased or decreased, during both measurement pulses in each period of the precession of the alkali metal vapor. As a result, the precession period of the alkali metal vapor is perceived by the detection system 26 as having changed, thus indicating that the timing controller 30 can change the timing signal TMR to adjust the period of the pulse repetition of providing both the optical pump beam $OPT_{PMP}$ and the optical probe beam $OPT_{PRB}$ accordingly (e.g., more frequent for an increase in amplitude or less frequent for a decrease in amplitude).

As another example, if the angle of the external magnetic field $B_{EXT}$ has changed, the detection system 26 will observe more optical power of the detection beam $OPT_{DET}$ on one of the first and second photodiodes 116 and 118 during the first measurement pulse in each period and more optical power on the other of the first and second photodiodes 116 and 118 during the second measurement pulse. In response to the detection system 26 detecting the opposing disparity of optical power of the detection beam $OPT_{DET}$ on the first and second photodiodes 116 and 118 in the two measurement pulses, the detection system 26 can command the timing controller 30 to change the timing signal TMR to move the timing of the measurement pulses either closer together in time (e.g., if the angle is getting closer to 45°) or farther apart in time (e.g., if the angle is getting closer to 90°).

As an example, at an angle of approximately 45°, the laser system 12 can be commanded via the timing signal TMR to provide a single angle-measurement pulse, occurring at the time $T_2$. Additionally, measurement pulses of the optical probe beam $OPT_{PRB}$ can be provided during the times of maximum sensitivity to magnetic gradients, corresponding to times $T_5$ and $T_6$ in the timing diagram 202, or at times $T_1$ and $T_3$ in the timing diagram 200. At any angle of the external magnetic field $B_{EXT}$ between approximately 45° and 90°, up to six optical probe beam $OPT_{PRB}$ pulses can be provided by the laser system 12 per precession period. For example, one optical probe beam $OPT_{PRB}$ pulse can be provided at each of the times $T_0/T_4$ and the time $T_2$, one optical probe beam $OPT_{PRB}$ pulse can be provided at each zero-crossing of the spin projection of the magnetic moment vector $B_{MM}$ along the optical probe beam $OPT_{PRB}$ (i.e., the solid line), and one optical probe beam $OPT_{PRB}$ pulse can be provided at each magnitude maximum of the dotted line in the example of FIG. 5.

Thus far, the magnetometer system 10 has been described with respect to determining a scalar value of the amplitude and frequency of the external magnetic field $B_{EXT}$ based on a measurement of the optical detection beam $OPT_{DET}$ through a single measurement zone (e.g., the first measurement zone 20) of the sensor cell 14. For example, the measurement of the optical detection beam $OPT_{DET}$ through the single measurement zone (e.g., the first measurement zone 20) of the sensor cell 14 can facilitate determining the precession of the alkali metal vapor for generating the timing signal TMR via the timing controller 30, and the measurement of the scalar amplitude and frequency of the external magnetic field $B_{EXT}$ based on the determined precession of the alkali metal vapor. However, as described in greater detail herein, the magnetometer system 10 can implement the second and third measurement zones 22 and 24 to determine the magnetic field gradient $B_{GRDT}$ of the external magnetic field $B_{EXT}$.

Figure 6:
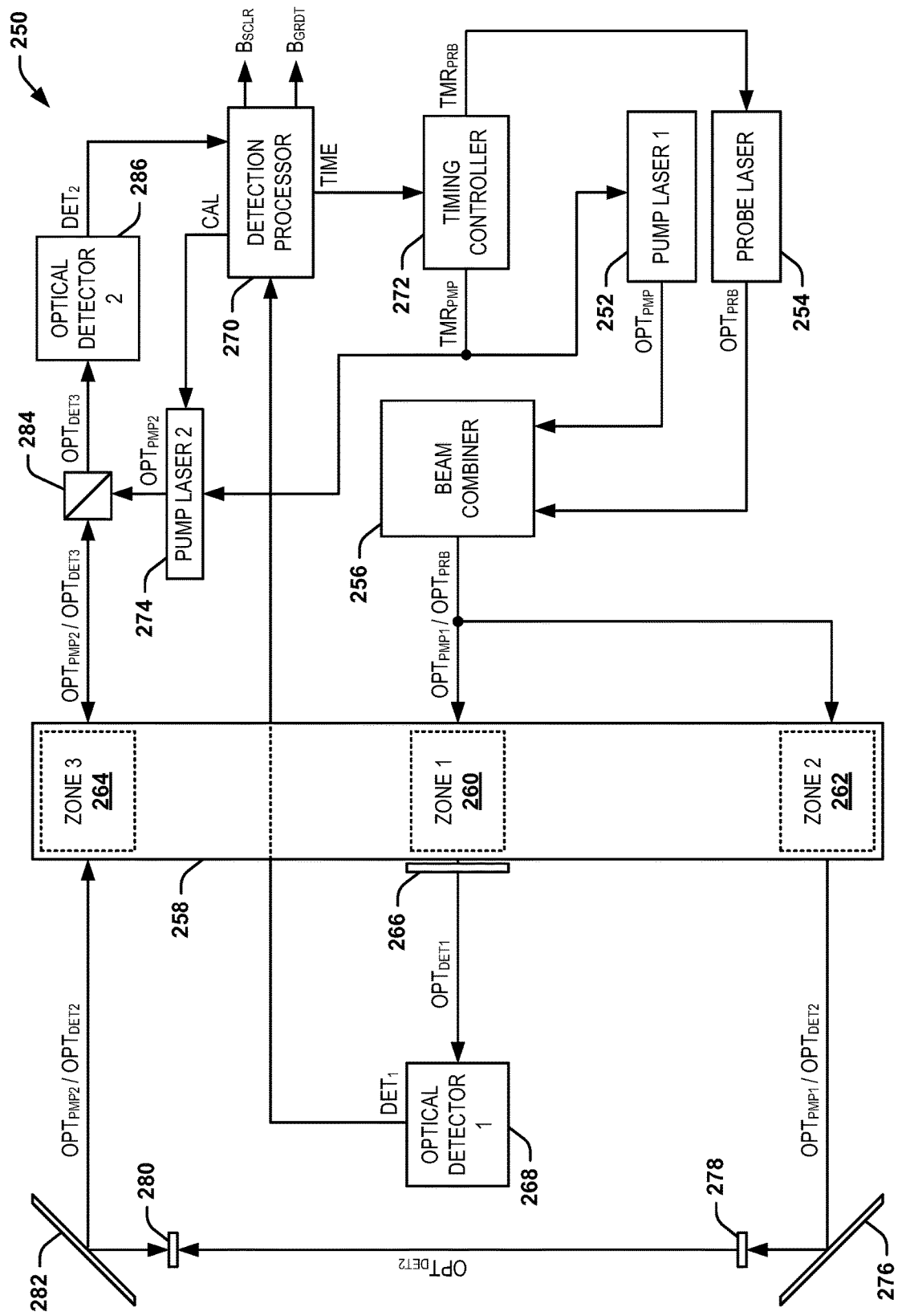
FIG. 6 illustrates another example of a magnetometer system.

FIG. 6 illustrates another example of a magnetometer system 250. The magnetometer system 250 can be implemented in any of a variety of applications to measure a magnetic field, such as navigation. For example, the magnetometer system 250 can be implemented in an inertial navigation system (INS) for an aircraft or a spacecraft to assist with real-time navigation or location determination.

The magnetometer system 250 includes a first pump laser 252 and a probe laser 254 that can collectively be part of the laser system 12 in the example of FIG. 1. The first pump laser 252 is configured to generate an optical pump beam $OPT_{PMP1}$, and the probe laser 254 is configured to generate an optical probe beam $OPT_{PRB}$. The first optical pump beam $OPT_{PMP1}$ and the optical probe beam $OPT_{PRB}$ are combined via a beam combiner 256. As an example, the beam combiner 256 can be configured as a 2×2 optical combiner to provide power efficient optical coupling (e.g., as opposed to a 2×1 optical combiner that can exhibit a 3 dB loss). The beam combiner 256 is demonstrated as providing a combined beam axis, demonstrated in the example of FIG. 6 as $OPT_{PMP1}/OPT_{PRB}$. The combined beam axis $OPT_{PMP1}/OPT_{PRB}$ can correspond to a coaxial combination of the first optical pump beam $OPT_{PMP1}$ and the optical probe beam $OPT_{PRB}$. It is to be understood that the first optical pump beam $OPT_{PMP1}$ and the optical probe beam $OPT_{PRB}$ are not necessarily concurrently provided together as the combined beam axis $OPT_{PMP1}/OPT_{PRB}$, but merely share an optical axis.

The combined beam axis, demonstrated in the example of FIG. 6 as $OPT_{PMP1}/OPT_{PRB}$, is provided through a sensor cell 258 that includes an alkali metal vapor disposed therein. In the example of FIG. 6, the sensor cell 258 includes a first measurement zone 260 ("ZONE 1"), a second measurement zone 262 ("ZONE 2"), and a third measurement zone 264 ("ZONE 3") that can each correspond to three-dimensional spatial regions within the volume of the sensor cell 258. In the example of FIG. 6, the first measurement zone 260 is arranged approximately centrally along a length of the sensor cell 258, and the second and third measurement zones 262 and 264 are arranged at opposing ends of the sensor cell 258. The combined beam axis $OPT_{PMP1}/OPT_{PRB}$ is demonstrated in the example of FIG. 6 as being provided through the first measurement zone 260 and the second measurement zone 262 via the beam coupler 256.

As described previously, the first optical pump beam $OPT_{PMP1}$ can be provided through the first and second measurement zones 260 and 262 to facilitate precession of the alkali metal vapor in the first and second measurement zones 260 and 262 in response to the external magnetic field. Therefore, the first optical pump beam $OPT_{PMP1}$ can align the magnetic moment of the alkali metal vapor in an approximately parallel manner with respect to the first optical pump beam $OPT_{PMP1}$. Therefore, the alkali metal vapor can precess about the external magnetic field based on the alignment of the magnetic moment of the alkali metal vapor, as described with reference to the examples of FIGS. 2-4.

In the example of FIG. 6, a dichroic mirror 266 is demonstrated on the opposite side of the first measurement zone 260 to stop the first optical pump beam $OPT_{PMP1}$ but to allow a first detection beam $OPT_{DET1}$ corresponding to the optical probe beam $OPT_{PRB}$ passing through the first measurement zone 260 to pass to a first optical detector 268. The first optical detector 268 is configured to detect the Faraday rotation of the optical probe beam $OPT_{PRB}$ through the first measurement zone 260 based on the first detection beam $OPT_{DET1}$. The first optical detector 268 can provide a first detection signal $DET_1$ to a detection processor 270 that can correspond to a processor of the detection system 26 in the example of FIG. 1. In response to the first detection signal $DET_1$, the detection processor 270 can generate the scalar magnetic field $B_{SCLR}$ corresponding to the amplitude and angle of the external magnetic field $B_{EXT}$, as described previously in the examples of FIGS. 2-6.

In addition, the detection processor 270 can generate and adjust a timing reference TIME that is provided to a timing controller 272 that can correspond to the timing controller 30 in the example of FIG. 1. The timing controller 272 can generate a timing signal $TMR_{PMP}$ that is provided to the first pump laser 252 to indicate the timing of activation of the pulses of the first optical pump beam $OPT_{PMP1}$, similar to as described previously. In the example of FIG. 6, the magnetometer system 250 also includes a second pump laser 274 that is configured to generate a second optical pump beam $OPT_{PMP2}$ that is provided through the third measurement zone 264, as described in greater detail herein. The timing signal $TMR_{PMP}$ is thus also provided to the second pump laser 274 to indicate the timing of activation of the pulses of the second optical pump beam $OPT_{PMP2}$ concurrently with the pulses of the first optical pump beam $OPT_{PMP1}$. Similarly, the timing controller 272 can generate a timing signal $TMR_{PRB}$ that is provided to the probe laser 254 to indicate the timing of activation of the pulses of the optical probe beam $OPT_{PRB}$.

In addition, in the example of FIG. 6, the first optical pump beam $OPT_{PRB1}$ and a second detection beam $OPT_{DET2}$ corresponding to the optical probe beam $OPT_{PRB}$ passing through the second measurement zone 262 are demonstrated as a combined beam axis. The first optical pump beam $OPT_{PMP1}$ and the second detection beam $OPT_{DET2}$ are provided to a first mirror 276 to reflect the first optical pump beam $OPT_{PMP1}$ and the second detection beam $OPT_{DET2}$ to a dichroic mirror 278. The dichroic mirror 278 blocks the first pump beam $OPT_{PMP1}$ to provide the second detection beam $OPT_{DET2}$ through another dichroic mirror 280 to reflect from another mirror 282 and through the third measurement zone 264.

As described previously, the second optical pump beam $OPT_{PMP2}$ is provided through the third measurement zone 264. In the example of FIG. 6, the magnetometer system 250 includes a dichroic mirror 284 that is configured to reflect the second optical pump beam $OPT_{PMP2}$ and transmit a third detection beam $OPT_{DET3}$ as part of a combined beam axis that includes a third detection beam $OPT_{DET3}$ corresponding to the second detection beam $OPT_{DET2}$ passing through the third measurement zone 264 in the opposite direction as the second optical pump beam $OPT_{PMP2}$. In the example of FIG. 6, the second optical pump beam $OPT_{PMP2}$ and the second detection beam $OPT_{DET2}$ occupy a combined beam axis along opposite directions between the mirror 282 and the third measurement zone 264. The dichroic mirror 280 blocks the second optical pump beam $OPT_{PMP2}$.

The second detection beam $OPT_{DET2}$ experiences a Faraday rotation through the third measurement zone 264, which is exhibited in the third detection beam $OPT_{DET3}$. In the absence of a magnetic field gradient, the Faraday rotation is approximately identical to the Faraday rotation of the optical probe beam $OPT_{PRB}$ as it passes through the second measurement zone 262. However, because the second detection beam $OPT_{DET2}$ passes through the third measurement zone 264 after having undergone a net 180° reflection after the optical probe beam $OPT_{PRB}$ has passed through the second measurement zone 262, the Faraday rotation experienced by the second detection beam $OPT_{DET2}$ has been reflected; that is, it enters the third detection zone 264 in a direction that is opposite the Faraday rotation experienced by the optical probe beam $OPT_{PRB}$. Therefore, the third detection beam $OPT_{DET3}$ thus exhibits the Faraday rotation experienced by the second detection beam $OPT_{DET2}$, similar to the second detection beam $OPT_{DET2}$ exhibiting the Faraday rotation experienced by the optical probe beam $OPT_{PRB}$, in the same rotation direction. The third detection beam $OPT_{DET3}$ is provided through to a second optical detector 286. The second optical detector 286 is configured to detect the Faraday rotation of the second detection beam $OPT_{DET2}$ through the third measurement zone 264 based on the third detection beam $OPT_{DET3}$, and thus determines a difference in Faraday rotation between the second and third measurement zones 262 and 264, as described in greater detail herein. The second optical detector 286 can provide a second detection signal $DET_2$ to the detection processor 270 to determine the magnetic field gradient $B_{GRDT}$, as described in greater detail herein.

As an example, if the conditions of the alkali metal vapor in each of the second and third measurement zones 262 and 264 are approximately the same, then the Faraday rotation of the optical probe beam $OPT_{PRB}$ through the second measurement zone 262, as provided by the second detection beam $OPT_{DET2}$ and after reflection from mirrors 276 and 282, will be approximately equal and opposite the Faraday rotation of the second detection beam $OPT_{DET2}$ through the third measurement zone 264, as provided by the third detection beam $OPT_{DET3}$. As an example, the conditions can include the density of the alkali metal vapor, temperature of the sensor cell 258, or other varying calibration conditions differ between the second and third measurement zones 262 and 264. As another example, if the amplitude of the external magnetic field $B_{EXT}$ is the same in the second and third measurement zones 262 and 264 (e.g., there is no magnetic field gradient of the external magnetic field $B_{EXT}$), then similarly, the Faraday rotation of the optical probe beam $OPT_{PRB}$ through the second measurement zone 262, as provided by the second detection beam $OPT_{DET2}$, will after reflecting from mirrors 276 and 282 be approximately equal and opposite the Faraday rotation of the second detection beam $OPT_{DET2}$ through the third measurement zone 264, as provided by the third detection beam $OPT_{DET3}$. However, variations in the conditions of the alkali metal vapor in each of the second and third measurement zones 262 and 264 can result in a different amount of Faraday rotation.

As a result, upon the detection processor 270 determining that the third detection beam $OPT_{DET3}$ has a non-zero Faraday rotation via the second optical detector 286, then the detection processor 270 can determine that either the conditions of the alkali metal vapor, as described previously, are different, or a magnetic field gradient of the external magnetic field $B_{EXT}$ exists. For example, the detection processor 270 can determine if there is a non-zero Faraday rotation of the second detection beam $OPT_{DET2}$ based on the third detection beam $OPT_{DET3}$ during the calibration pulses of the optical probe beam $OPT_{PRB}$, such as provided in the first and second states 104 and 106 described in the example of FIG. 3.

If a non-zero Faraday rotation of the second detection beam $OPT_{DET2}$ based on the third detection beam $OPT_{DET3}$ is detected during the calibration pulses of the optical probe beam $OPT_{PRB}$, then the detection processor 270 can determine that the conditions of the alkali metal vapor (e.g., density, population, and/or temperature) are different between the second and third measurement zones 262 and 264. In response, the detection processor 270 can adjust the power of the second pump laser 274, such that the second optical pump beam $OPT_{PMP2}$ can compensate for the different conditions of the alkali metal vapor in a feedback manner. If the detection processor 270 determines that there is no (e.g., net zero) Faraday rotation of the second detection beam $OPT_{DET2}$ based on the third detection beam $OPT_{DET3}$ is detected during the calibration pulses of the optical probe beam $OPT_{PRB}$, then the detection processor 270 can determine that the conditions of the alkali metal vapor (e.g., density, population, and/or temperature) between the second and third measurement zones 262 and 264 are approximately the same, and thus that the magnetometer system 10 is calibrated with respect to the conditions of the alkali metal vapor in the sensor cell 258. However, if the detection processor 270 determines that there is no (e.g., net zero) Faraday rotation of the second detection beam $OPT_{DET2}$ based on the third detection beam $OPT_{DET3}$ is detected during the calibration pulses of the optical probe beam $OPT_{PRB}$, but determines that there is a non-zero Faraday rotation of the second detection beam $OPT_{DET2}$ based on the third detection beam $OPT_{DET3}$ during the interrogation pulses (e.g., during the third state 108 in the example of FIG. 3, such as corresponding to the times $T_5$ and $T_6$ in the example of FIG. 5), then the detection processor 270 can determine that there is a magnetic field gradient in the external magnetic field $B_{EXT}$. Accordingly, the detection processor 270 can measure the magnetic field gradient $B_{GRDT}$ based on the detected Faraday rotation via the third detection beam $OPT_{DET3}$.

As an example, the magnetometer system 250 can provide optical pumping and detection through multiple axes of the sensor cell 258 to provide greater precision and vector amplitude detection of the external magnetic field $B_{EXT}$. For example, the magnetometer system 250 can include optics or additional pump and probe lasers to provide optical pump beam(s) and optical probe beam(s) through at least one other orthogonal axis of the sensor cell 258 to provide additional measurements of the external magnetic field $B_{EXT}$. Accordingly, the magnetometer system 250 can measure the amplitude, vector angles, and magnetic field gradients associated with the external magnetic field $B_{EXT}$ based on providing pump and probe beam pulses through multiple orthogonal directions through the sensor cell 258.

Figure 7:
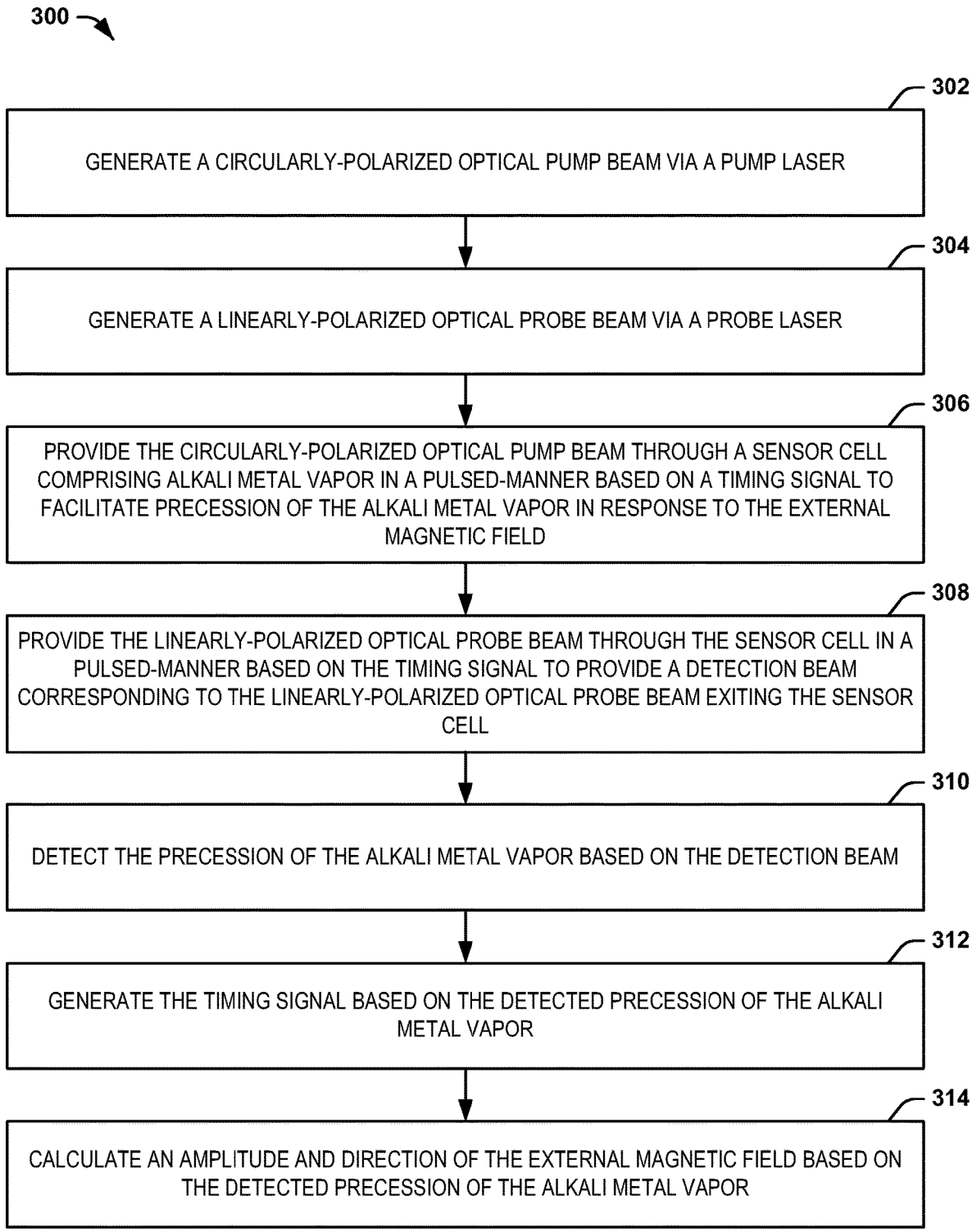
FIG. 7 illustrates an example of a method for measuring an external magnetic field.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 illustrates an example of a method 300 for measuring an external magnetic field (e.g., the external magnetic field $B_{EXT}$). At 302, a circularly-polarized optical pump beam (e.g., the optical pump beam $OPT_{PMP}$) is generated via a pump laser (e.g., the pump laser(s) 14). At 304, a linearly-polarized optical probe beam (e.g., the optical probe beam $OPT_{PRB}$) is generated via a probe laser (e.g., the probe laser(s) 16). At 306, the circularly-polarized optical pump beam is provided through a sensor cell (e.g., the sensor cell 18) comprising alkali metal vapor in a pulsed-manner based on a timing signal (e.g., the timing signal TMR) to facilitate precession of the alkali metal vapor in response to the external magnetic field. At 308, the linearly-polarized optical probe beam is provided through the sensor cell in a pulsed-manner based on the timing signal to provide a detection beam (e.g., the detection beam $OPT_{DET}$) corresponding to the linearly-polarized optical probe beam exiting the sensor cell. At 310, the precession of the alkali metal vapor is detected based on the detection beam. At 312, the timing signal is generated based on the detected precession of the alkali metal vapor. At 314, an amplitude and direction of the external magnetic field are calculated based on the detected precession of the alkali metal vapor.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A magnetometer system comprising:
   a sensor cell comprising alkali metal vapor;
   a laser system configured to provide an optical pump beam through the sensor cell in a pulsed manner to facilitate precession of the alkali metal vapor in response to an external magnetic field and to provide an optical probe beam through the sensor cell in a pulsed manner based on a precession frequency of the alkali metal vapor; and
   a detection system configured to detect the precession of the alkali metal vapor in response to a detection beam corresponding to the optical probe beam exiting the sensor cell and to calculate an amplitude and direction of the external magnetic field based on the detected precession of the alkali metal vapor.

2. The system of claim 1, wherein the sensor cell comprises a first measurement zone, a second measurement zone, and a third measurement zone, wherein the second and third measurement zones are arranged at opposite ends of the sensor cell, wherein the detection system is configured to detect the precession of the alkali metal vapor in response to a first detection beam, a second detection beam, and a third detection beam corresponding to the optical probe beam exiting the sensor cell through each of the respective first, second, and third measurement zones.

3. The system of claim 2, wherein the optical pump beam is provided through each of the first, second, and third measurement zones, wherein the optical probe beam is provided through the first measurement zone in the pulsed manner to calculate the amplitude and direction of the external magnetic field, wherein the optical probe beam is provided through each of the second and third measurement zones to calculate a magnetic field gradient across the sensor cell.

4. The system of claim 2, wherein the optical probe beam is provided through the second measurement zone to generate the second detection beam, wherein the second detection beam is reflected through the third measurement zone to generate the third detection beam, such that the third detection beam is associated with the precession of the alkali metal vapor in each of the second and third measurement zones.

5. The system of claim 4, wherein the laser system comprises a 2×2 optical coupler configured to axially combine the optical pump beam and the optical probe beam as a first combined beam axis through the first measurement zone and a second combined beam axis through the second measurement zone.

6. The system of claim 2, wherein the laser system comprises:
   a first pump laser configured to generate a first optical pump beam that is provided through each of the first and second measurement zones in a pulsed manner to facilitate precession of the alkali metal vapor in each of the first and second measurement zones in response to the external magnetic field; and
   a second pump laser configured to generate a second optical pump beam that is provided through the third measurement zone to facilitate precession of the alkali metal vapor in the third measurement zone in response to the external magnetic field.

7. The system of claim 6, wherein the laser system further comprises a probe laser configured to generate the optical probe beam, wherein the optical probe beam is configured to provide a calibration optical probe beam concurrently with each of the first and second optical pump beams, wherein the laser system is further configured to calibrate the second pump laser in response to a difference between the second detection beam and the third detection beam.

8. The system of claim 7, wherein the optical probe beam is configured to provide a startup beam at an initial startup of the magnetometer system to provide an initial detection beam, wherein the detection system is configured to generate an initial estimate of the precession frequency of the alkali metal vapor and to determine an initial amplitude and direction of the external magnetic field based on the initial estimate of the precession frequency.

9. The system of claim 1, wherein the detection system comprises a timing controller configured to generate a timing signal based on the detected precession of the alkali metal vapor in response to the detection beam, wherein the timing controller is configured to control timing of application of pulses associated with the optical pump beam and to control timing of application of pulses associated with the optical probe beam based on the timing signal to track changes in the amplitude and/or direction of the external magnetic field based on the detection beam.

10. The system of claim 1, wherein the optical pump beam and the optical probe beam have a common optical axis, wherein the detection system is configured to command the laser system to provide an optical pump beam pulse in response to a magnetic moment of the alkali metal vapor being approximately parallel with the common optical axis based on the detected precession of the alkali metal vapor, and is further configured to command the laser system to provide an optical probe beam pulse in response to the magnetic moment of the alkali metal vapor being approximately orthogonal with the common optical axis based on the detected precession of the alkali metal vapor to monitor the precession of the alkali metal vapor.

11. The system of claim 10, wherein the detection system is further configured to command the laser system to provide an optical probe beam pulse in response to a magnetic moment of the alkali metal vapor being each of approximately parallel with the common optical axis and approximately anti-parallel with the common optical axis based on the detected precession of the alkali metal vapor to calibrate the magnetometer system.

12. A method for measuring an external magnetic field via a magnetometer system, the method comprising:
  generating a circularly-polarized optical pump beam via a pump laser;
  generating a linearly-polarized optical probe beam via a probe laser;
  providing the circularly-polarized optical pump beam through a sensor cell comprising alkali metal vapor in a pulsed-manner based on a timing signal to facilitate precession of the alkali metal vapor in response to the external magnetic field;
  providing the linearly-polarized optical probe beam through the sensor cell in a pulsed-manner based on the timing signal to provide a detection beam corresponding to the linearly-polarized optical probe beam exiting the sensor cell;
  detecting the precession of the alkali metal vapor based on the detection beam;
  generating the timing signal based on the detected precession of the alkali metal vapor; and
  calculating an amplitude and direction of the external magnetic field via a detection processor based on the detected precession of the alkali metal vapor, the detection processor providing the amplitude and direction of the external magnetic field as an output.

13. The method of claim 12, wherein providing the circularly-polarized optical pump beam through the sensor cell and providing the linearly-polarized optical probe beam through the sensor cell comprises providing each of the circularly-polarized optical pump beam and the linearly-polarized optical probe beam through each of a first measurement zone, a second measurement zone, and a third measurement zone, wherein the second and third measurement zones are arranged at opposite ends of the sensor cell, wherein detecting the precession of the alkali metal vapor comprises detecting the precession of the alkali metal vapor in response to a first detection beam, a second detection beam, and a third detection beam corresponding to the optical probe beam exiting the sensor cell through each of the respective first, second, and third measurement zones.

14. The method of claim 13, wherein calculating the amplitude and direction of the external magnetic field via the detection processor comprises calculating a scalar magnitude of the amplitude and direction of the external magnetic field in response to the first detection beam and calculating a magnetic field gradient in response to the second and third detection beams, wherein the output of the detection processor comprises the scalar magnitude of the amplitude of the external magnetic field, the direction of the external magnetic field, and the magnetic field gradient.

15. The method of claim 13, wherein providing the linearly-polarized optical probe beam through the sensor cell comprises:
  providing the linearly-polarized optical probe beam through the first measurement zone to generate the first detection beam; and
  providing the linearly polarized optical probe beam through the second measurement zone to generate the second detection beam; and
  reflecting the second detection beam through the third measurement zone via optics to generate the third detection beam, such that the third detection beam is associated with the precession of the alkali metal vapor in each of the second and third measurement zones.

16. The method of claim 12, wherein providing the linearly-polarized optical probe beam comprises providing the linearly-polarized optical probe beam through the sensor cell in response to a magnetic moment of the alkali metal vapor being each of approximately parallel with the common optical axis and after the magnetic moment of the alkali vapor has precessed approximately 180° based on the detected precession of the alkali metal vapor to calibrate the magnetometer system.

17. A magnetometer system comprising:
  a sensor cell comprising alkali metal vapor and comprising a first measurement zone, a second measurement zone, and a third measurement zone, wherein the second and third measurement zones are arranged at opposite ends of the sensor cell;
  a laser system configured to provide an optical pump beam through each of the first, second, and third measurement zones of the sensor cell in a pulsed manner to facilitate precession of the alkali metal vapor in response to an external magnetic field and to provide an optical probe beam through each of the first, second, and third measurement zones of the sensor cell in a pulsed manner based on a precession frequency of the alkali metal vapor; and
  a detection system configured to detect the precession of the alkali metal vapor in response to a first detection beam, a second detection beam, and a third detection beam corresponding to the optical probe beam exiting the sensor cell through the first, second, and third measurement zones, respectively, to calculate a scalar amplitude and direction of the external magnetic field in response to the first detection beam, and to calculate a magnetic field gradient of the external magnetic field in response to the second and third detection beams.

18. The system of claim 17, wherein the optical probe beam is provided through the second measurement zone to generate the second detection beam, wherein the second detection beam is reflected through the third measurement zone to generate the third detection beam, such that the third detection beam is associated with the precession of the alkali metal vapor in each of the second and third measurement zones.

19. The system of claim 17, wherein the detection system comprises a timing controller configured to generate a timing signal based on the detected precession of the alkali metal vapor in response to the first detection beam, wherein the timing controller is configured to control timing of application of pulses associated with the optical pump beam and to control timing of application of pulses associated with the optical probe beam based on the timing signal to track changes in the amplitude and/or direction of the external magnetic field based on the detection beam.

20. The system of claim 17, wherein the optical pump beam and the optical probe beam have a common optical axis, wherein the detection system is further configured to command the laser system to provide an optical probe beam pulse in response to a magnetic moment of the alkali metal vapor being each of approximately parallel with the common optical axis and after the magnetic moment of the alkali vapor has precessed by approximately 180° based on the detected precession of the alkali metal vapor to calibrate the magnetometer system.

* * * * *